United States Patent
Tsutsumi et al.

(10) Patent No.: US 7,030,716 B2
(45) Date of Patent: Apr. 18, 2006

(54) DUPLEXER HAVING TWO SURFACE ACOUSTIC WAVE FILTERS ON ONE SUBSTRATE

(75) Inventors: Jun Tsutsumi, Kawasaki (JP); Shogo Inoue, Kawasaki (JP); Takashi Matsuda, Kawasaki (JP); Masanori Ueda, Yokohama (JP)

(73) Assignees: Fujitsu Media Devices Limited, Yokohama (JP); Fujitsu Limited, Kawasaki (JP)

( * ) Notice: Subject to any disclaimer, the term of this patent is extended or adjusted under 35 U.S.C. 154(b) by 80 days.

(21) Appl. No.: 10/827,337

(22) Filed: Apr. 20, 2004

(65) Prior Publication Data

US 2004/0212452 A1  Oct. 28, 2004

(30) Foreign Application Priority Data

Apr. 28, 2003  (JP)  ............................. 2003-124384

(51) Int. Cl.
*H03M 9/72* (2006.01)
*H03M 9/64* (2006.01)

(52) U.S. Cl. ...................................... 333/133; 333/193
(58) Field of Classification Search ................. 333/133
See application file for complete search history.

(56) References Cited

U.S. PATENT DOCUMENTS

| | | | | |
|---|---|---|---|---|
| 5,864,260 A | * | 1/1999 | Lee | 333/133 |
| 6,369,672 B1 | * | 4/2002 | Ikada | 333/193 |
| 6,380,823 B1 | * | 4/2002 | Ikata et al. | 333/133 |
| 6,469,593 B1 | * | 10/2002 | Nishizawa et al. | 333/133 |
| 6,566,981 B1 | * | 5/2003 | Urabe et al. | 333/193 |
| 6,765,456 B1 | * | 7/2004 | Ehara et al. | 333/133 |

FOREIGN PATENT DOCUMENTS

| | | |
|---|---|---|
| JP | 7-263997 | 10/1995 |
| JP | 9-199986 | 7/1997 |
| JP | 2002-237739 | 8/2002 |
| JP | 2003-51731 | 2/2003 |

* cited by examiner

*Primary Examiner*—Barbara Summons
(74) *Attorney, Agent, or Firm*—Arent Fox PLLC

(57) ABSTRACT

A duplexer includes two surface acoustic wave filters that are formed on one substrate, at least one of the two surface acoustic wave filters being a ladder filter. In this duplexer, the positional difference between the centers in the surface acoustic wave propagating direction of each two neighboring comb-like electrodes among comb-like electrodes that form series-arm resonators in the ladder filter is equal to or smaller than a fourth of the length in the propagating direction of the comb-like electrode having the larger number of pairs of electrode fingers of each two neighboring comb-like electrodes.

11 Claims, 19 Drawing Sheets

DUPLEXER HAVING TWO SURFACE ACOUSTIC WAVE FILTERS ON ONE SUBSTRATE

BACKGROUND OF THE INVENTION

1. Field of the Invention

The present invention generally relates to duplexers, and more particularly, to a duplexer utilizing surface acoustic wave filters.

2. Description of the Related Art

Antenna duplexers each having two surface acoustic wave (SAW) filters are used for mobile communication devices, especially for 800 MHz band portable telephone devices today. These SAW filters used for antenna duplexers are required to have high power durability to perform stable operations and achieve long lives. Accordingly, the two filters of each duplexer have normally been formed with ladder filters that have SAW devices connected in a ladder-like fashion and exhibit relatively high power durability.

As there has been an increasing demand for smaller-sized portable telephone devices and mobile communication devices, SAW filters that can be relatively easily made smaller in size are preferred for antenna duplexers used for 1.9 GHz band mobile communication systems (such as Personal Communications Services (PCS) for the North American market, for example).

To produce smaller-sized antenna duplexers is expected whether it is for an 800 MHz band device or a 1.9 GHz band device. A smaller-sized antenna duplexer can be produced by forming two SAW filters on one substrate (as disclosed in Japanese Patent Application No. 2002-237739, for example).

However, two SAW filters formed on a small substrate in an attempt to produce a smaller device cause problems such as a decrease in the degree of stop-band suppression and an increase in crosstalk between transmission signals and reception signals. These problems are conspicuous especially in 1.9 GHz band antenna duplexers than in 800 MHz band antenna duplexers, and for this reason, it has been difficult to produce 1.9 GHz band antenna duplexers utilizing SAW filters.

So as to eliminate the problem of crosstalk between transmission signals and reception signals, two SAW filters are formed on two separate substrates to produce an antenna duplexer.

However, the SAW filters should preferably be formed simultaneously on one substrate to produce an antenna duplexer, and the reason for this is as follows. When two SAW filters are formed on two separate substrates, the center frequencies of the two SAW filters fluctuates with variations in electrode film thickness and electrode finger width between process batches. As a result, the gap between the center frequencies fluctuate by twice as much as the fluctuation of the center frequency of each SAW filter, causing large variations in the characteristics of antenna duplexers. When two SAW filters are formed simultaneously on one substrate, on the other hand, the center frequencies of the two SAW filters are not affected by variations in the electrode film thickness and the electrode finger width. Accordingly, the gap between the two center frequencies does not vary greatly, and antenna duplexers with desired filter characteristics can be obtained. As described above, the characteristics of each antenna duplexer are greatly affected by the gap between the center frequencies of the two SAW filters. It is therefore preferable to form two SAW filters simultaneously on one substrate to achieve a higher yield.

As already mentioned, there are market demands for higher-frequency antenna duplexers and smaller-sized antenna duplexers. If both of the demands are to be met, however, the crosstalk between transmission signals and reception signals increases. Therefore, it has been very difficult to achieve good filter characteristics.

SUMMARY OF THE INVENTION

It is therefore an object of the present invention to provide duplexers in which the above disadvantage is eliminated.

A more specific object of the present invention is to provide a duplexer that has two or more SAW filters on a single substrate and exhibits excellent filter characteristics.

The above objects of the present invention are achieved by a duplexer comprising two surface acoustic wave filters that are formed on one substrate, at least one of the two surface acoustic wave filters being a ladder filter, wherein the positional difference between the centers in a surface acoustic wave propagating direction of each two neighboring comb-like electrodes among comb-like electrodes that form series-arm resonators in the ladder filter is equal to or smaller than a fourth of the length in the propagating direction of the comb-like electrode having the larger number of pairs of electrode fingers of each two neighboring comb-like electrodes.

The above objects of the present invention are also achieved a duplexer comprising two surface acoustic wave filters that are formed on one substrate, at least one of the two surface acoustic wave filters being a ladder filter, wherein comb-like electrodes that form series-arm resonators in the ladder filter are arranged in the direction perpendicular to a surface acoustic wave propagating direction; and a first straight line connecting an input terminal integrally formed with the comb-like electrode forming the input-stage series-arm resonator of the ladder filter to an output terminal integrally formed with the comb-like electrode forming the output-stage series-arm resonator of the ladder filter deviates from the straight line extending perpendicularly to the propagating direction, so that the angle of the first straight line with respect to a second straight line connecting an input terminal to an output terminal provided in a package that accommodates the substrate is smaller than the angle of the second straight line with respect to the straight line extending perpendicularly to the surface acoustic wave propagating direction on the substrate.

The above objects of the present invention are achieved by a duplexer comprising two surface acoustic wave filters that are formed on one substrate, at least one of the two surface acoustic wave filters being a ladder filter, wherein a first straight line connecting the center of a comb-like electrode forming the input-stage series-arm resonator of the ladder filter to the center of a comb-like electrode forming the output-stage series-arm resonator of the ladder filter deviates from the straight line extending perpendicularly to a surface acoustic wave propagating direction, so that the angle of the first straight line with respect to a second straight line connecting an input terminal and an output terminal provided in a package that accommodates the substrate is smaller than the angle of the second straight line with respect to the straight line extending perpendicularly to the surface acoustic wave propagating direction on the substrate.

The above objects of the present invention are also achieved by a duplexer comprising: two surface acoustic wave filters that are formed on one substrate; and a ground electrode that is provided between the two surface acoustic wave filters on the substrate.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

The following is a description of embodiments of the present invention, with reference to the accompanying drawings.

(First Embodiment)

Figure 1:
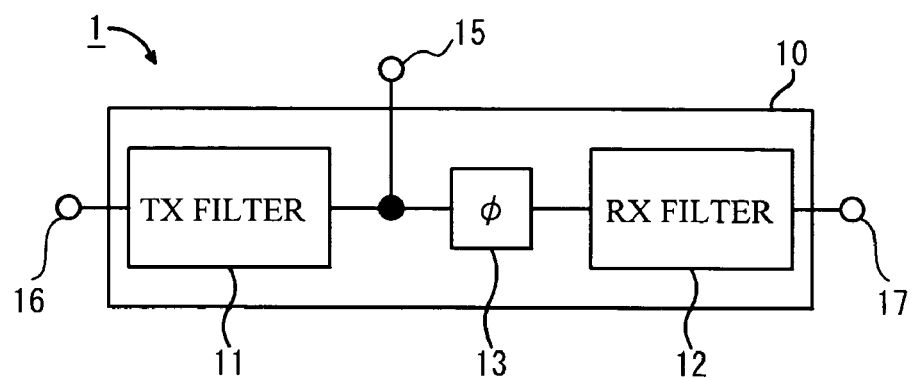
FIG. 1 is a circuit diagram illustrating the structure of a duplexer in accordance with a first embodiment of the present invention.

A first embodiment of the present invention will be first described in detail. FIG. 1 is a block diagram illustrating the structure of a duplexer 1 in accordance with this embodiment. The duplexer 1 has surface acoustic wave (SAW) filters (a transmission filter 11 and a reception filter 12) formed on a substrate 10. A phase shifter 13 that is a matching circuit for matching input impedances is provided between the two SAW filters 11 and 12, i.e., the phase shifter 13 is provided on the line that connects the SAW filters 11 and 12 to an antenna port 15 serving as a common terminal of the SAW filters 11 and 12.

In this embodiment, both of the two filters 11 and 12 may be ladder filters, or one of the two filters 11 and 12 may be a coupled multi-mode filter. In the following embodiments, the transmission filter 11 is embodied by a ladder filter 110 shown in FIG. 2, and the reception filter 12 is embodied by a double-mode SAW (hereinafter referred to as DMS) filter 120 shown in FIG. 3.

Figure 2:
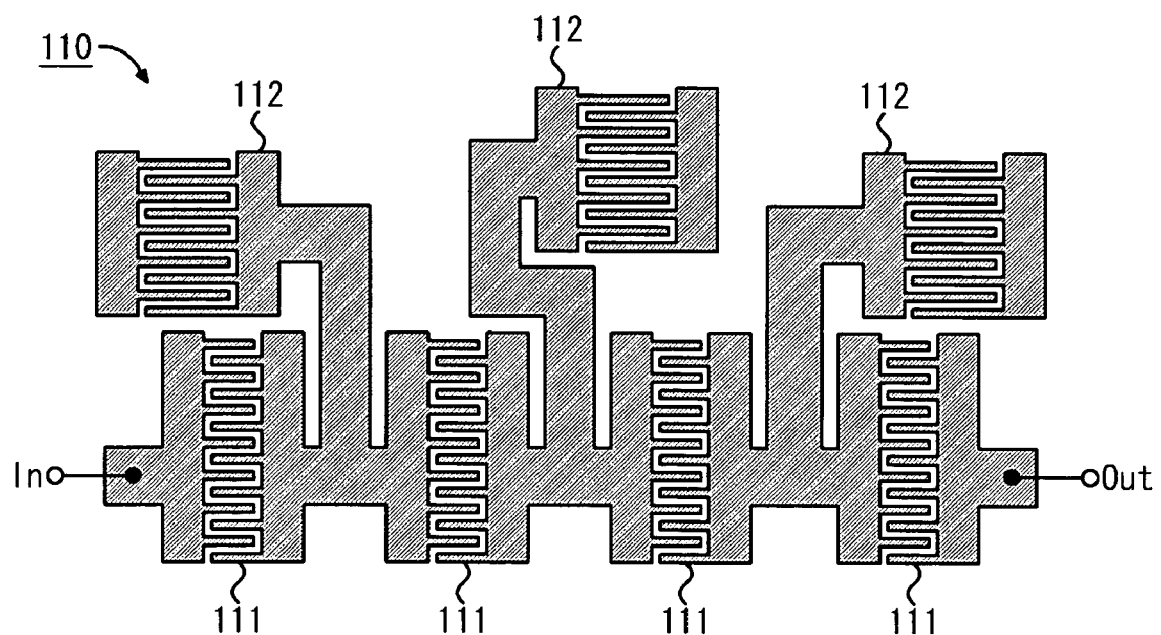
FIG. 2 is a top view of a ladder filter to be employed in the duplexer in accordance with the first embodiment.

As shown in FIG. 2, the ladder filter 110 includes comb-like electrodes (interdigital transducers; hereinafter referred to as the IDTs) 111 connected in series, and IDTs 112 connected in parallel to the IDTs 111. Here, resonators that include the IDTs 111 connected in series arms are series-arm resonators, and resonators that include the IDTs 112 connected in parallel arms are parallel-arm resonators. The series-arm resonators are arranged in series arms while the parallel-arm resonators are arranged in parallel arms in a ladder-like structure.

Figure 3:
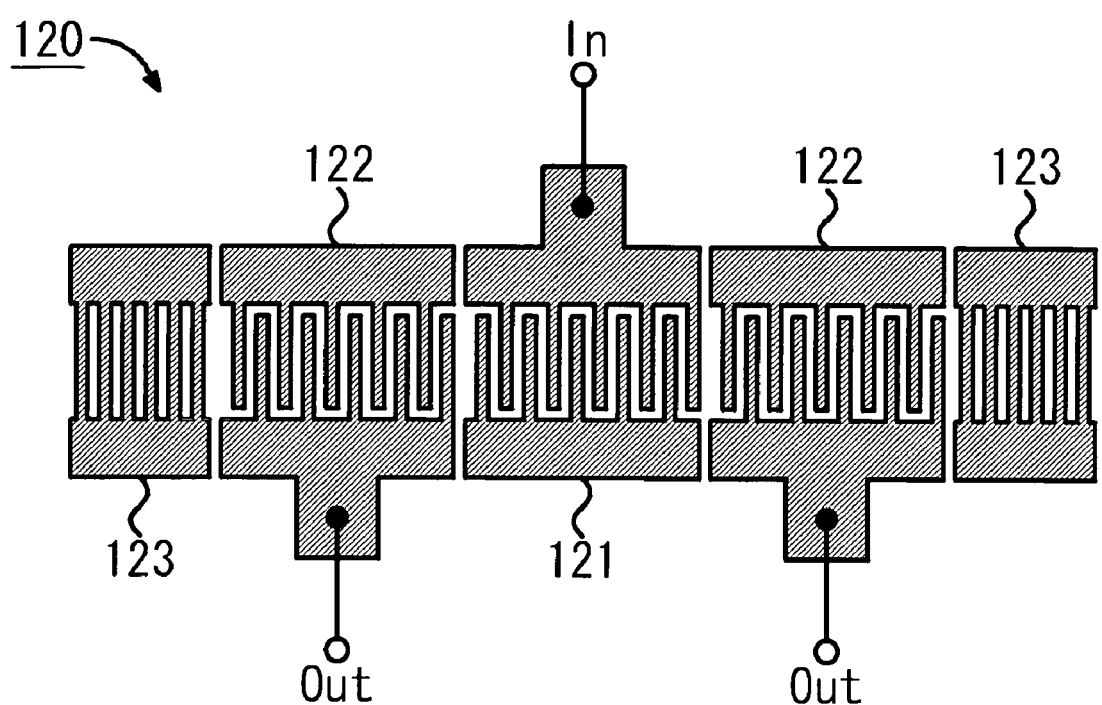
FIG. 3 is a top view of a DMS filter to be employed in the duplexer in accordance with the first embodiment.

On the other hand, a coupled multi-mode filter exhibits a great degree of stop-band suppression over a wider frequency range than a ladder filter does. The coupled multi-mode filter shown in FIG. 3 includes an IDT 121 and two IDTs 122 arranged longitudinally, with a reflection electrode 123 being provided on either end of the arrangement. The IDT 121 is connected to the input end, while the IDTs 122 are connected to the output end. In the coupled multi-mode filter thus configured, SAW is excited, propagated and received. The coupled multi-mode filter shown in FIG. 3 is the double-mode SAW (DMS) filter 120.

As the ladder filter 110 is an electric circuit having the SAW resonators as an impedance element formed by the IDTs 111 and 112, the degree of stop-band suppression of the ladder filter 110 is not as great as that of a coupled multi-mode filter (the DMS filter 120, for example), due to adverse influence of stray capacitance. Accordingly, one of the SAW filters 11 and 12 of the duplexer 1 is embodied by a coupled multi-mode filter (the DMS filter 12, for example), so as to reduce crosstalk between transmission signals and reception signals. This structure will be described below, with reference to FIGS. 4 and 5.

Figure 4:
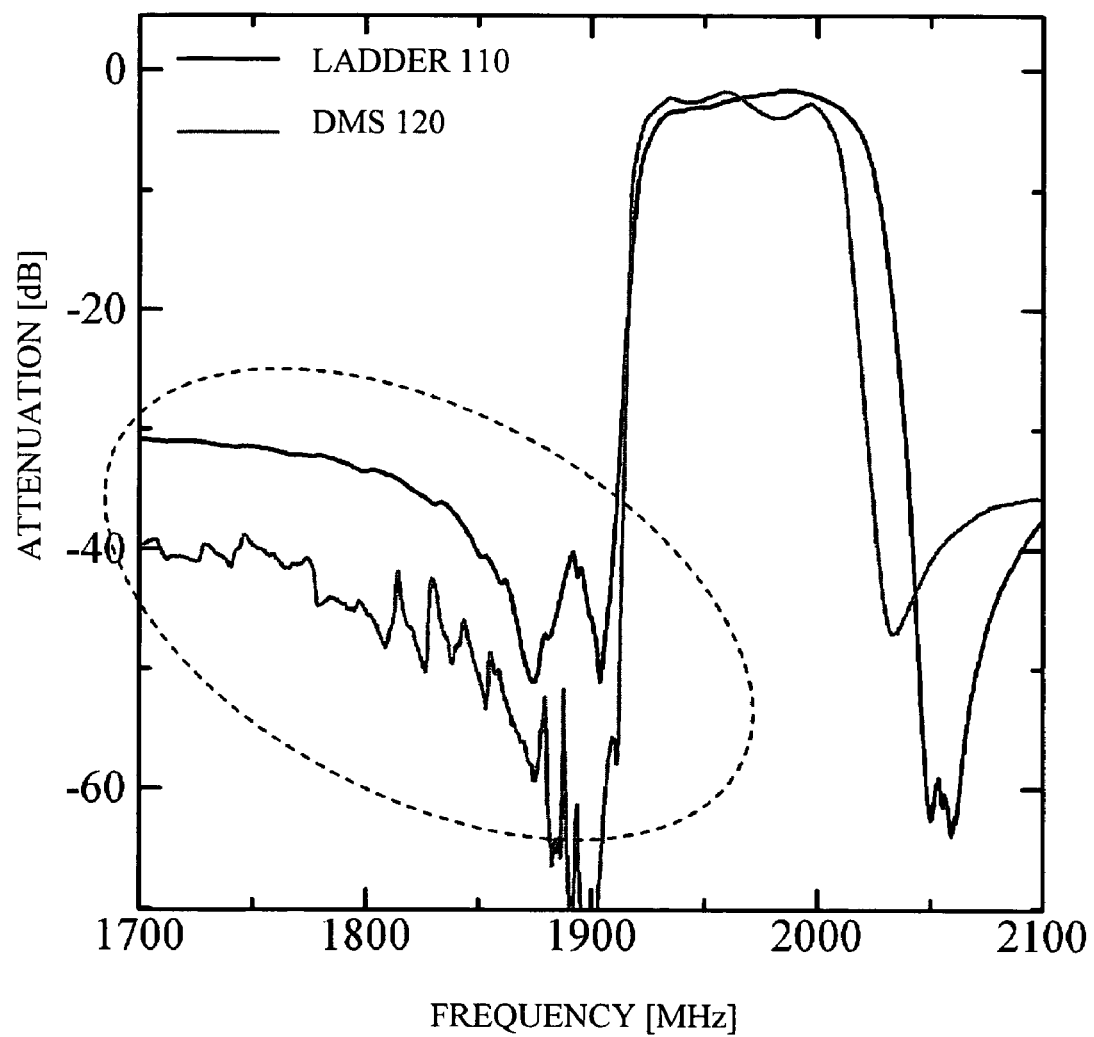
FIG. 4 is a graph showing the filter characteristics of the ladder filter shown in FIG. 2 and the filter characteristics of the DMS filter shown in FIG. 3.

FIG. 4 shows the filter characteristics of the ladder filter 110 and the filter characteristics of the DMS filter 120. In this description, the ladder filter 110 and the DMS filter 120 will be described as 1.9 GHz bandpass filters. As is apparent from FIG. 4, the ladder filter 110 and the coupled multi-mode filter 120 each exhibits a very small insertion loss in a certain frequency band. Accordingly, the ladder filter 110 and the coupled multi-mode filter 120 can be considered to have the same filter characteristics in terms of passband insertion loss. As for the stop-band suppression on the low frequency side (represented by the region surrounded by the broken line in FIG. 4), the DMS filter 120 excels the ladder filter 110 by approximately 10 dB.

Figure 5:
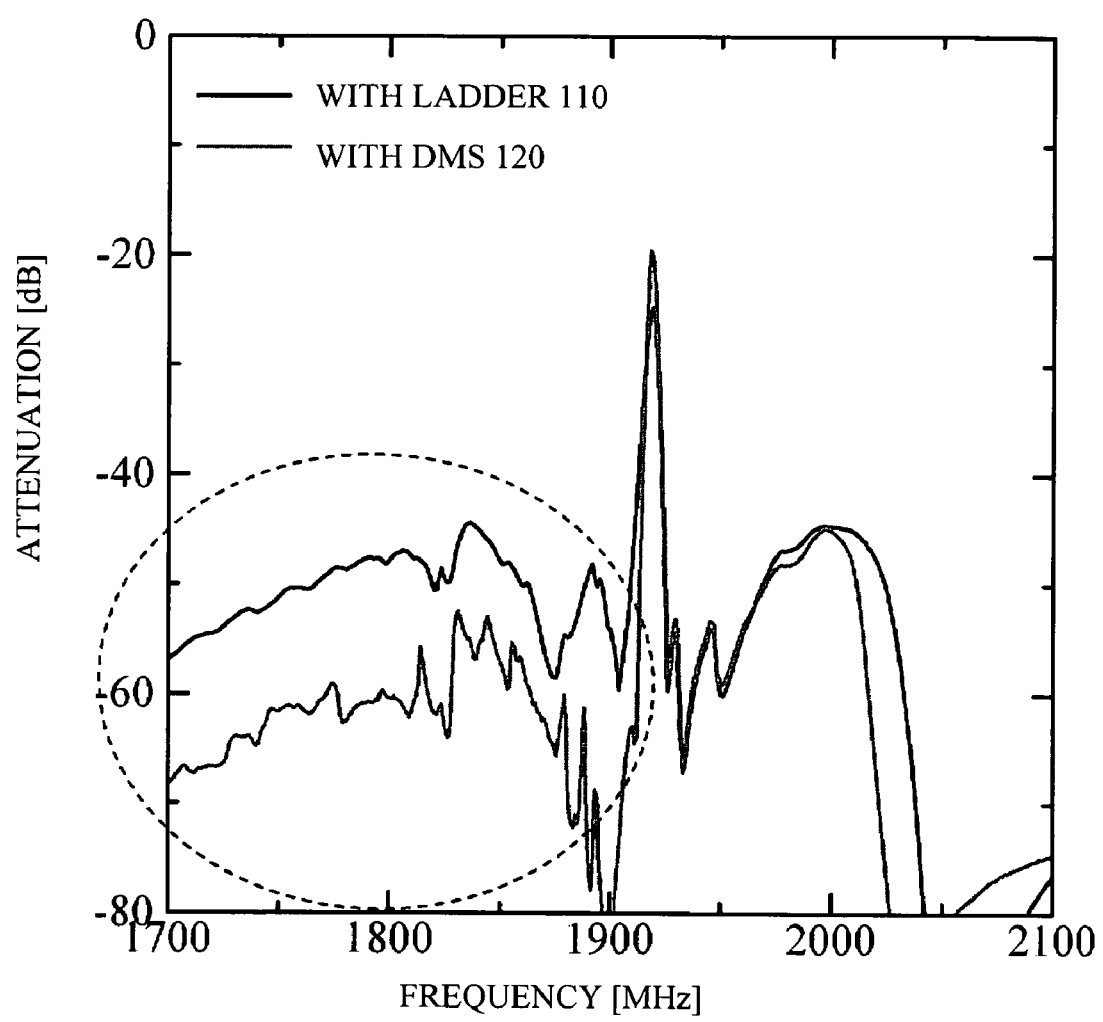
FIG. 5 shows a comparison between the crosstalk characteristics seen in a case of employing the ladder filter of FIG. 2 as the reception filter of the duplexer of FIG. 1 and the crosstalk characteristics seen in a case of employing the DMS filter of FIG. 3 as the reception filter of the duplexer of FIG. 1.

FIG. 5 shows the results of a simulation performed for examining the crosstalk from the transmission end to the reception end in a case where the high frequency filter (the reception filter 12) is the DMS filter 120, and a simulation performed for examining the crosstalk from the transmission end to the reception end in a case where the reception filter 12 is the ladder filter 110. In these simulations, the low frequency filter (the transmission filter 11) of the duplexer 1 is the ladder filter 110.

As is apparent from FIG. 5, the degree of suppression, especially the degree of suppression in the low frequency region (represented by the region surrounded by the broken line in FIG. 5), is improved with the DMS filter 120 as the reception filter 12, compared with the case of the ladder filter 110 as the reception filter 12. This is because the degree of stop-band suppression of the DMS filter 120 in that region is greater than that of the ladder filter 110 (also see FIG. 4). Judging from the results, it is obvious that more excellent characteristics in terms of crosstalk can be obtained with a structure having the DMS filter 120 (or any coupled multi-mode filter) as one of the two SAW filters of the duplexer 1.

A coupled multi-mode filter, however, is poorer in power durability than a ladder filter. For this reason, if the two SAW filters 11 and 12 are formed with coupled multi-mode filters, the power durability of the duplexer 1 greatly decreases. So as to maintain high power durability while improving the filter characteristics, it is preferable to employ the DMS filter 120 as one of the two SAW filters 11 and 12.

The ladder filter 110 and the DMS filter 120 (especially the IDTs 111, 112, 121, and 122) should preferably be made of the same metallic material with the same film thickness. This effectively simplifies the design and production process, and also cancels automatically variations of the center frequencies of the two SAW filters 11 and 12 caused by variations of the electrode film thickness between process batches and electrode finger widths. Accordingly, simultaneous formation of the transmission filter 11 and the reception filter 12 brings about a correlation in the variations of the electrode film thickness and electrode finger widths caused during the production process. As a result, a correlation appears also in the variations of the center frequencies between the two filters 11 and 12. As the difference between the center frequencies of the two SAW filters 11 and 12 that change in synchronization with each other does not greatly change, desired filter characteristics can be easily obtained, and the yield of the duplexer 1 can be increased.

The IDTs 111, 112, 121, and 122 that form the two SAW filters 11 and 12 may be electrode films that are made of a metallic material mainly containing aluminum (Al), for example. However, it is also possible to form a single-layer structure that mainly contains a metallic material other than aluminum (Al), or to form a multi-layer structure that includes such single layers. The metallic material other than aluminum (Al) may be titanium (Ti), copper (Cu), gold (Au), molybdenum (Mo), tungsten (W), tantalum (Ta), chromium (Cr), platinum (Pt), ruthenium (Ru), or rhodium (Rh), for example.

The substrate 10 on which the two SAW filters 11 and 12 are formed may be a piezoelectric single-crystal substrate of 42° Y-cut X-propagation lithium tantalate that is a 42° rotated Y-cut plate (hereinafter referred to as a LT substrate), or a piezoelectric single-crystal substrate of 42° Y-cut X-propagation lithium niobate that is a 42° rotated Y-cut plate (hereinafter referred to as a LN substrate), for example. The substrate 10 may also be a piezoelectric element substrate made of a piezoelectric material such as crystal (hereinafter referred to as a piezoelectric substrate). With a LT substrate, the insertion loss is small. With a LT substrate using a 39° to 44° rotated Y-cut plate, the insertion loss is also small. However, it is more preferable to use a 41° to 43° rotated Y-cut plate.

The above structure having one of the SAW filters 11 and 12 formed by the ladder filter 110 will be described below in greater detail. With this structure, it is possible to produce a small-sized duplexer, without deterioration in the characteristics of each SAW filter.

Figure 6A:
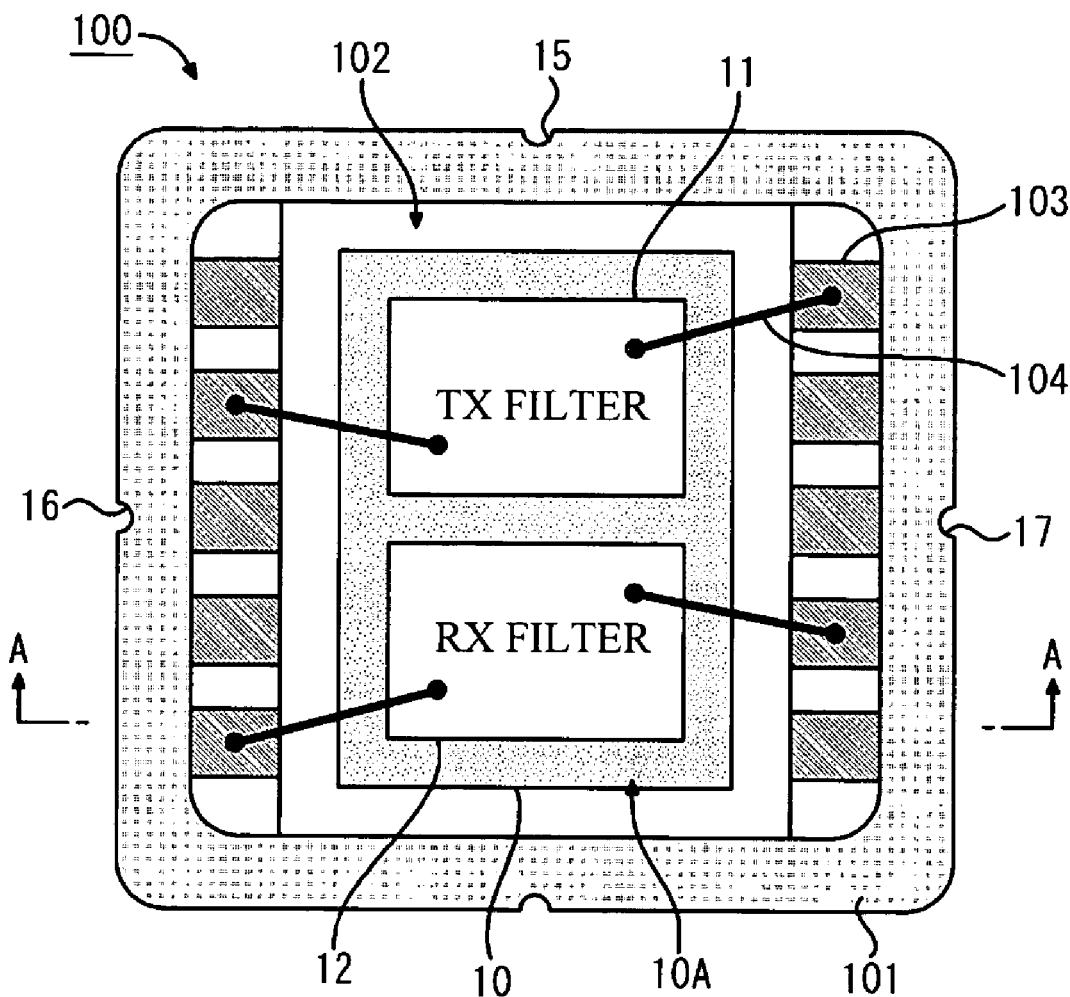
FIG. 6A is a top view of a duplexer as a product in accordance with the first embodiment of the present invention.
Figure 6B:
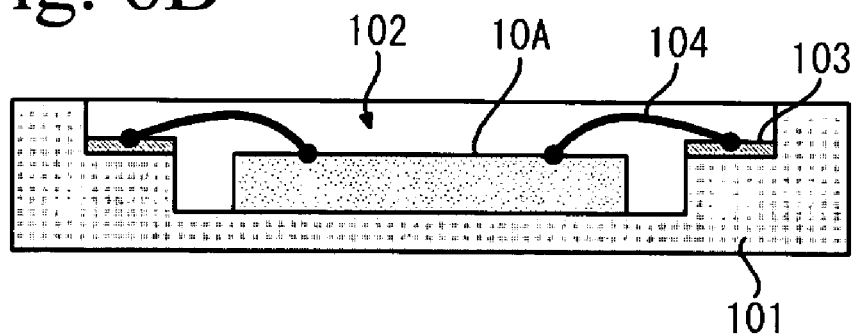
FIG. 6B is a section view of the duplexer as a product, taken along the line A—A of FIG. 6A.

FIGS. 6A and 6B illustrate the structure of a duplexer 100 as a product having the two SAW filters 11 and 12 mounted on a package 101 in accordance with this embodiment. In FIGS. 6A and 6B, the same components as those of the duplexer 1 shown in FIG. 1 are denoted by the same reference numerals as the corresponding ones of FIG. 1. FIG. 6A is a top view of the duplexer 100, and FIG. 6B is a section view of the duplexer 100, taken along the line A—A of FIG. 6A.

As shown in FIGS. 6A and 6B, the duplexer 100 includes an antenna port 15, a transmission port 16, and a reception port 17 that are connected to an external antenna, a transmission circuit, and a reception circuit, respectively. In this structure, the transmission port 16 is arranged on the opposite side to the reception port 17. In a cavity 102 formed in the package 101, a SAW device chip 10A having a transmission filter 11 and a reception filter 12 formed on a substrate 10 is mounted in a face-up state, i.e., in a state in which the surface (the upper surface) having the IDTs 111, 112, 121, and 122 of the SAW filters 11 and 12 formed thereon faces upward. Meanwhile, the lower surface of the SAW device chip 10A is bonded to the bottom surface of the cavity 102 of the package 101, so that the package 101 and the SAW device chip 10A are secured to each other. Input/output terminals that are formed on the substrate 10 and are electrically connected to the IDTs 111, 112, 121, and 122, are also electrically connected to input/output terminals and a ground terminal (hereinafter collectively referred to as the terminals 103) formed in the cavity 102 through wires 104. Shortly, in the duplexer 100, the SAW device chip 10A is face-up mounted in the cavity 102 of the package 101, and the input/output terminals of the IDTs 111, 112, 121, and 122 are wire-bonded to the terminals 103 of the package 101.

Figure 7:
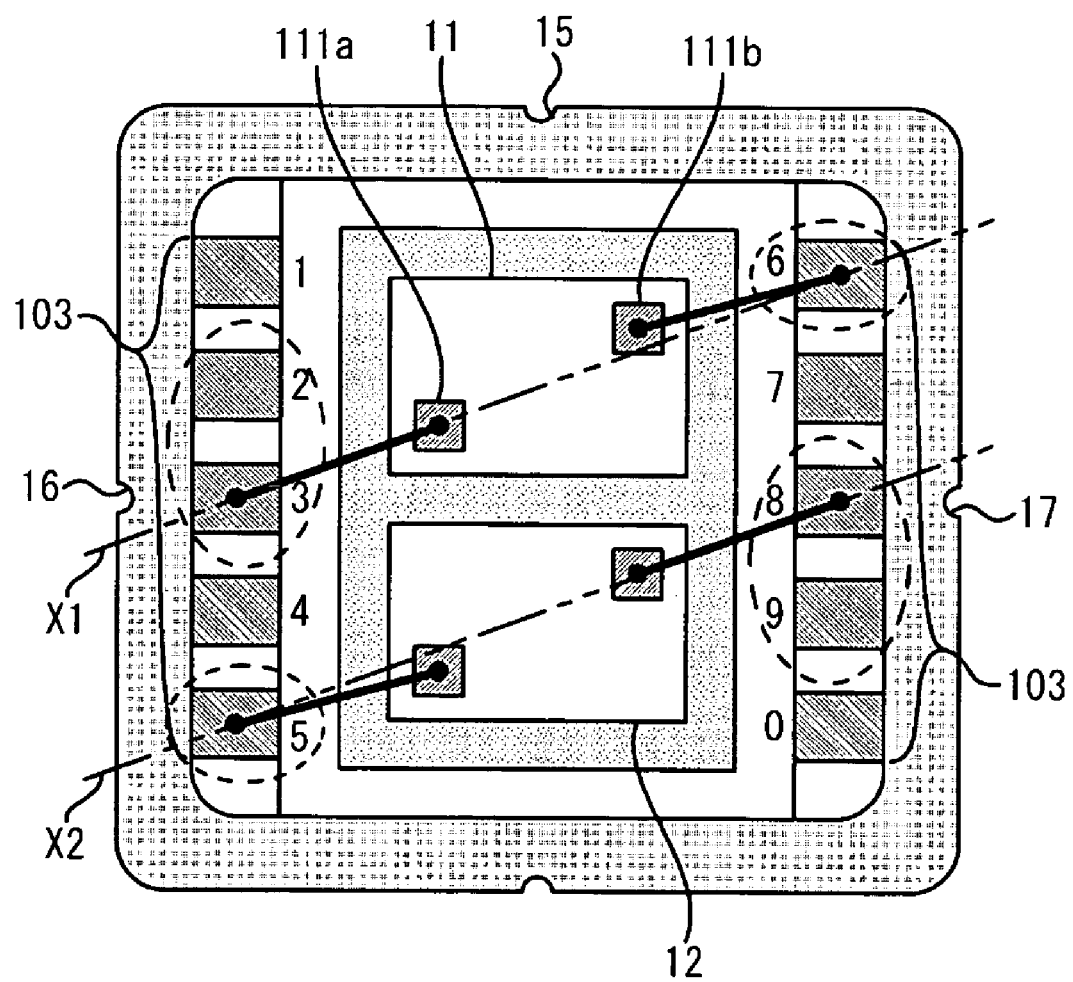
FIG. 7 shows the relationship between the terminals of the package of the duplexer shown in FIG. 6, and the transmission filter and the reception filter of the duplexer shown in FIG. 6.

So as to maintain the capacity or the size of the cavity 102 while preventing the package 101 from becoming larger, it is advantageous that the terminals 103 are arranged on only two sides of the cavity 102. Here, numbers from "0" to "9" are allotted to the terminals 103 of the package, as shown in FIG. 7. It is preferable to use the terminal "2" or "3" as the input terminal for the transmission filter 11 connected to a transmission circuit, taking the locations of the transmission port 16 and the transmission filter 11 into consideration. Also, it is preferable to use the terminal "8" or "9" as the output terminal for the reception filter 12 connected to a reception circuit, taking the locations of the reception port 17 and the reception filter 12 into consideration. With this arrangement, the wires 104 connecting those terminals can be made as short as possible, and the insertion loss of each filter can be reduced. Further, it is preferable to use the terminals "6" and "5" as the output terminal for the transmission filter 11 and the input terminal for the reception filter 12 both connected to the antenna port 15. By doing so, the interaction between the input terminal "2" or "3" and the output terminal "8" or "9" can be reduced. Shortly, the input terminals and the output terminal of the package 101 for the transmission filter 11 are preferably the terminals 103 by which the transmission filter 11 is diagonally flanked, and the input terminal and the output terminal of the package 101 for the reception filter 12 are preferably the terminals 103 by which the reception filter 12 is diagonally flanked. With this arrangement, the interaction between the terminals 103 is reduced, and the insertion loss of each filter can be reduced.

In this structure, the straight line X1 that connects one of the input terminal and the output terminal of the package 101 for the transmission filter 11 diagonally crosses the transmission filter 11 of the SAW device chip 10A. Likewise, the straight line X2 that connects the input terminal and the output terminal of the package 101 for the reception filter 12 diagonally crosses the reception filter 12 of the SAW device chip 10A. The structure of the transmission filter 11 and/or the reception filter 12 may be formed with a ladder filter 110a shown in FIG. 8. In the ladder filter 110a, series-arm resonators formed by IDTs 111 are obliquely arranged along the straight lines. More specifically, the straight line that connects the input-stage IDT 111 and the output stage IDT 111 deviates from the straight line extending perpendicularly to the SAW propagating direction, so that the angle of the straight line that connects the center of the IDT 111 of the input-stage series-arm resonator to the center of the IDT 111 of the output-stage series-arm resonator with respect to the straight line (X1/X2) that connects the input terminal and the output terminal provided on the package 101 that accommodates the substrate 10 is smaller than the angle of the straight line (X1/X2) that connects the input terminal and the output terminal of the package 101 with respect to the direction perpendicular to the SAW propagating direction. By doing so, the wire 104 that connects the input terminal 111a integrally formed with the input-stage IDT 111 to the input terminal of the package 101, and the wire 104 that connects the output terminal 111b integrally formed with the output-stage IDT 111 to the output terminal of the package 101, can be both made shorter, and the insertion loss can be reduced accordingly. Here, the SAW propagating direction of each IDT 111 as well as each IDT 112 is equal to the X-direction of the substrate (LT substrate) 10. Accordingly, the above structure has the series-arm resonators obliquely arranged with respect to the SAW propagating direction of the series-arm resonators (i.e., the X-direction of the substrate 10).

Figure 8:
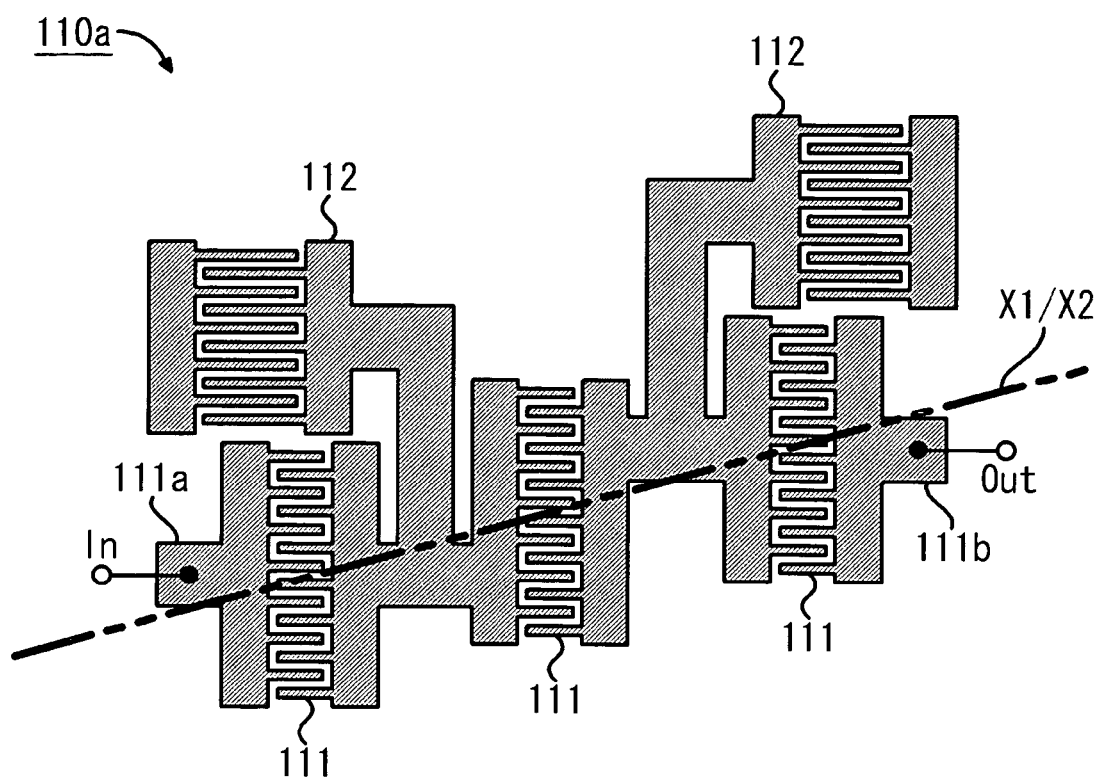
FIG. 8 is a top view of another ladder filter in accordance with the first embodiment of the present invention.

In the structure shown in FIG. 8, parallel-arm resonators formed by IDTs 112 are arranged on the same side of the straight line connecting the series-arm resonators. As a result, dead space becomes large, and so does the chip area of the ladder filter 110. So as to avoid this, a ladder filter 110b shown in FIG. 9 has the IDT 112 of the input-stage parallel-arm resonator and the IDT 112 of the output-stage parallel-arm resonator arranged on opposite sides of the straight line connecting the series-arm resonators. With this arrangement, the dead space can be reduced, and the chip area can be reduced accordingly. Furthermore, as the chip area of a SAW filter is reduced, two SAW filters can be located at a longer distance from each other. Thus, crosstalk between the transmission filter 11 and the reception filter 12 can also be reduced.

Figure 10:
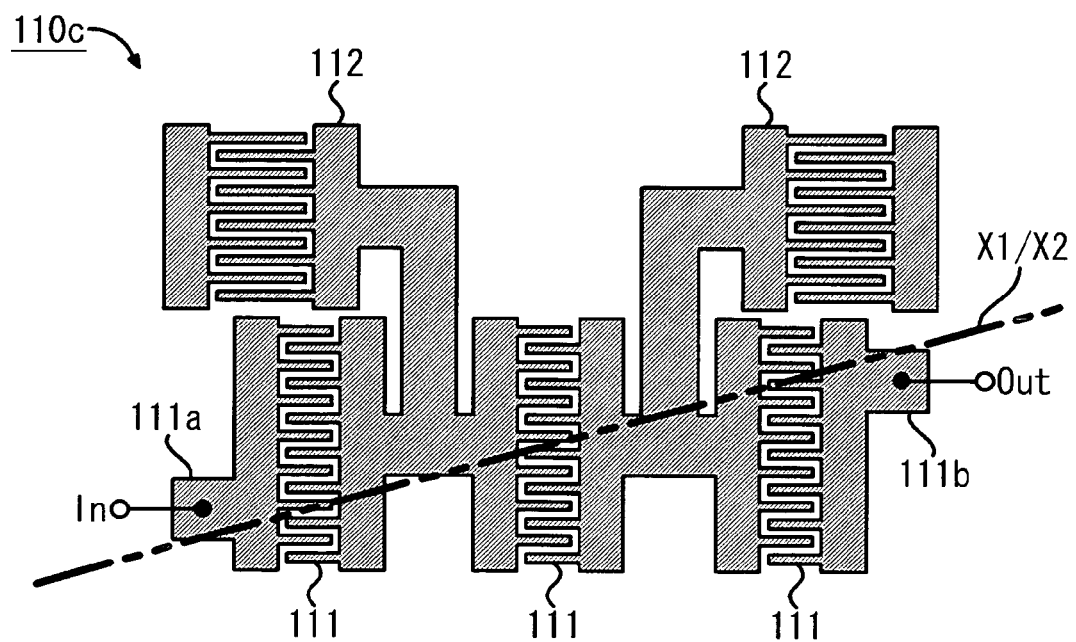
FIG. 10 is a top view of still another ladder filter in accordance with the first embodiment.

FIG. 10 shows an example of a ladder filter in which an increase of chip area is prevented, and the wire 104 connecting the input terminal 111a of the input-stage series-arm resonator to the input terminal of the package 101 and the wire 104 connecting the output terminal 111b of the output-stage series-arm resonator to the output terminal of the package 101 are shortened. In the ladder filter 110c shown in FIG. 10, the series-arm resonators are aligned transversely, which is to say, the series-arm resonators are aligned in the direction perpendicular to the SAW propagating direction (X-direction). In this ladder filter 110c, the location of the input terminal 111a is out of the horizontal line extending from the location of the output terminal 111b, so that the straight line connecting the center of the input terminal 111a and the center of the output terminal 111b can become almost parallel to the straight line X1/X2 (the straight line connecting the input terminal and the output terminal of the package 101). In other words, the straight line connecting the input terminal 111a and the output terminal 111b deviates from the straight line extending perpendicularly to the SAW propagating direction, so that the angle of the straight line connecting the center of the input terminal 111a integrally formed with the IDT 111 of the input-stage series-arm resonator to the center of the output terminal 111b integrally formed with the IDT 111 of the output series-arm resonator with respect to the straight line (X1/X2) connecting the input terminal and the output terminal of the package 101 that accommodates the substrate 10 is smaller than the angle of the straight line (X1/X2) connecting the input terminal and the output terminal of the package 101 with respect to the direction perpendicular to the SAW propagating direction on the substrate 10. As this structure does not have the series-arm resonator arranged obliquely with respect to the SAW device chip 10A, the chip area can be made smaller than the chip area of the ladder filter 110a shown in FIG. 8. Accordingly, the transmissions filter 11 and the reception filter 12 can be located at an even longer distance from each other in this structure. Thus, crosstalk between transmission signals and reception signals can be reduced.

Figure 9:
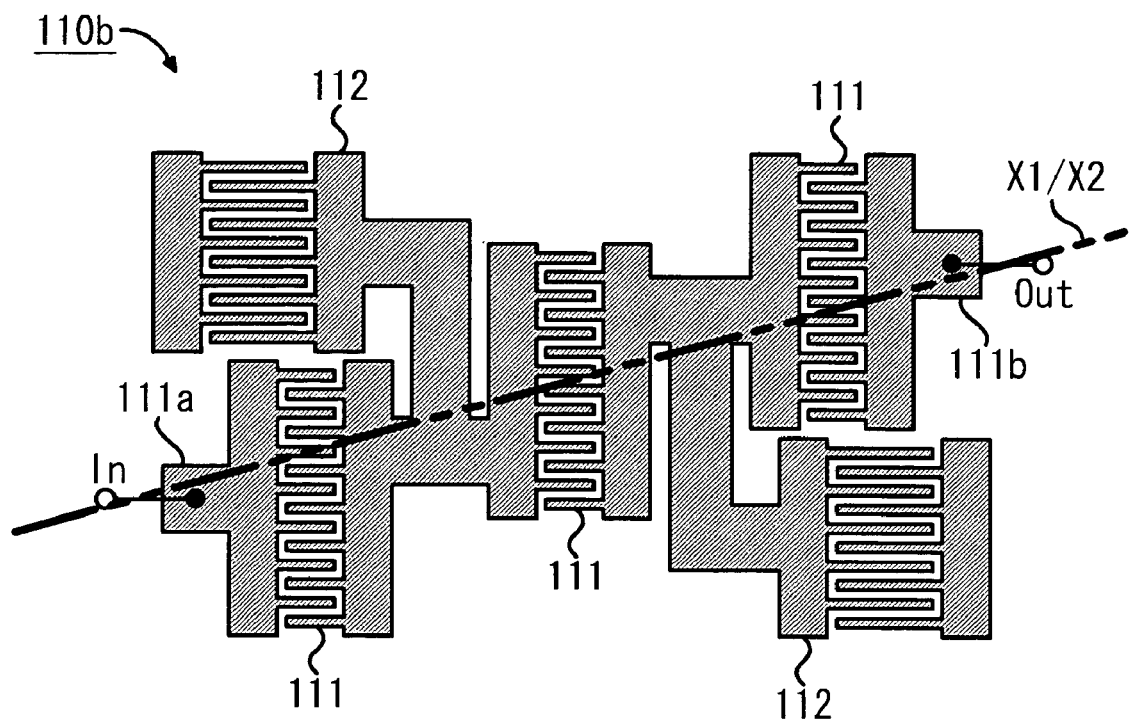
FIG. 9 is a top view of yet another ladder filter in accordance with the first embodiment.
Figure 11:
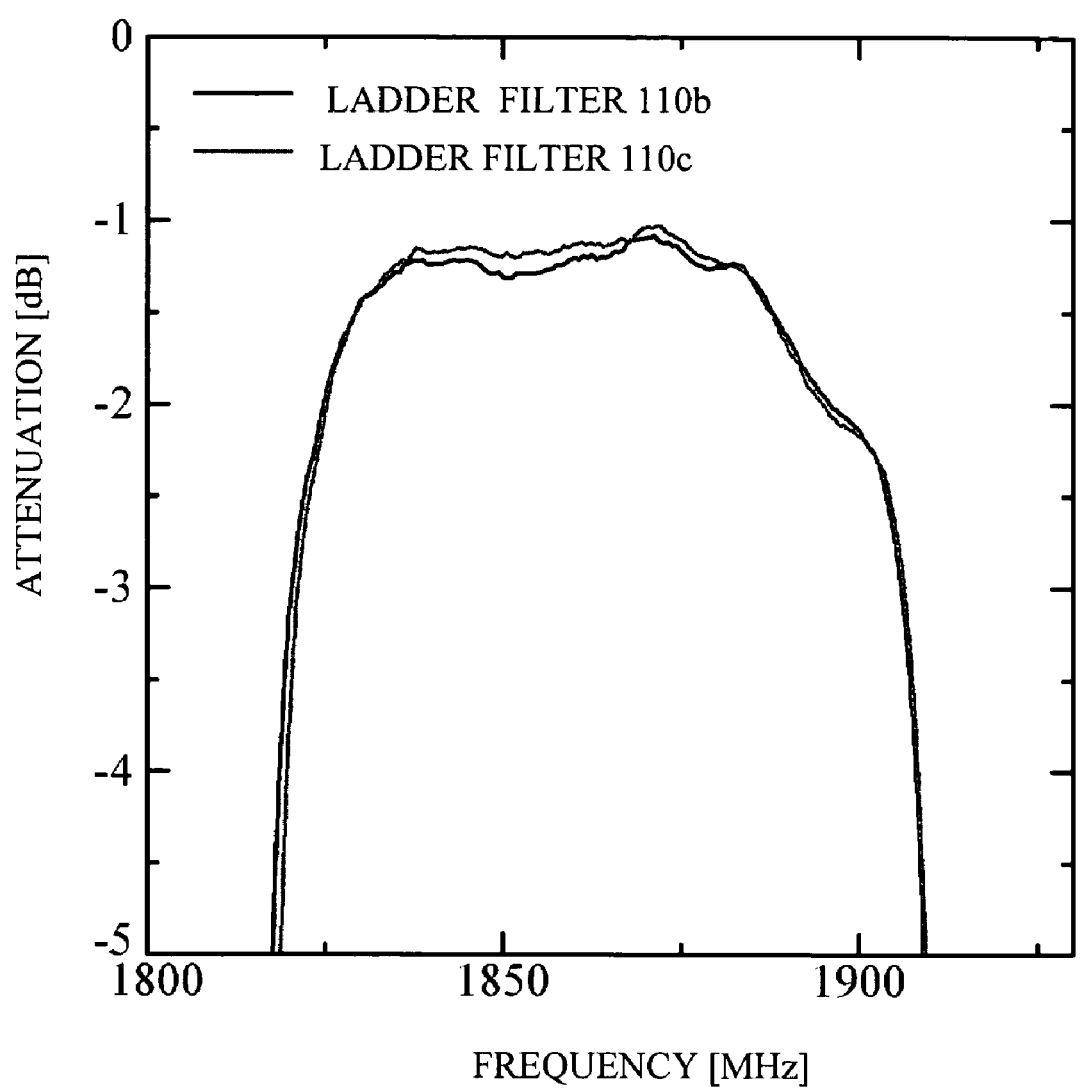
FIG. 11 shows the filter characteristics of the ladder filters shown in FIGS. 9 and 10.
Figure 12:
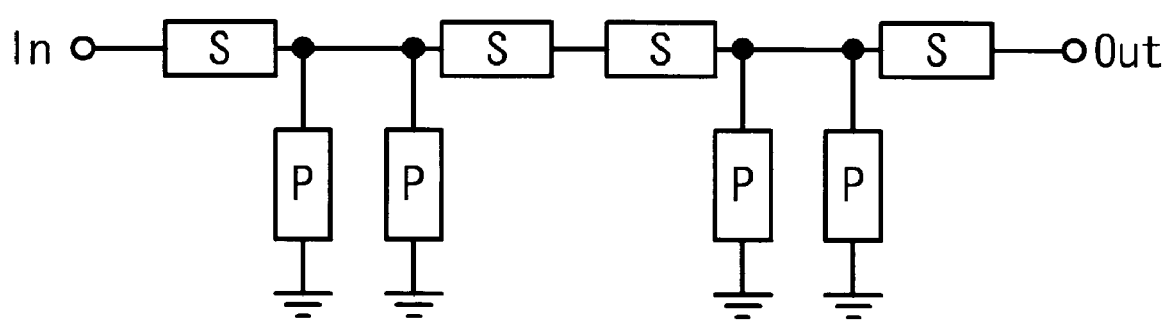
FIG. 12 is a circuit diagram illustrating the structure of each ladder filter in accordance with the first embodiment of the present invention.

FIG. 11 shows the filter characteristics of the ladder filter 110b shown in FIG. 9 and the ladder filter 110c shown in FIG. 10. In this description, each of the ladder filters 110b and 110c is a transmission filter with a transmission band of 1850 to 1910 MHz in compliance with the PCS (Personal Communications Services) standard, and the center frequency is 1880 MHz. The ladder filter 10b shown in FIG. 9 and the ladder filter 110c shown in FIG. 10 both have a four-stage structure having an arrangement represented by S-P-P-S-S-P-P-S, with each S indicating a series-arm resonator and each P indicating a parallel-arm resonator, as shown in FIG. 12. In this structure, the IDT 111 in the center is shared between the second-stage series-arm resonator S and the third-stage series-arm resonator S. Also, the IDT 112 on the input end is shared between the first-stage parallel resonator P and the second-stage parallel-arm resonator P. Likewise, the IDT 112 on the output end is shared between the third-stage parallel resonator P and the fourth-stage parallel resonator P.

As is apparent from FIG. 11, the ladder filter 110c having the series-arm resonators aligned transversely has a smaller insertion loss than the ladder filter 110b. In view of this, the ladder filter 110c has more preferable filter characteristics.

In this embodiment, the IDTs 111 that form the series-arm resonators are aligned transversely, which is, aligned under the following conditions (also see FIG. 11). Not only in the ladder filters 110, 110a, 110b, and 110c shown in FIG. 2 and FIGS. 8 through 10, but also in any ladder filter having three or more IDTs 111 forming series-arm resonators, the positional difference in the SAW propagating direction between the centers of each of (N−2) or more pairs of IDTs 111 should be equal to or shorter than a fourth of the length in the SAW propagating direction of the IDT 111 with the larger number of pairs of electrode fingers (i.e., with the larger number of IDT electrode fingers).

The reason that the centers of (N−2) or more pairs of IDTs 111 are considered is as follows. In the ideal arrangement, there is not a positional difference between the centers of each two neighboring IDTs 111, which is, there is not a positional difference among the centers of (N−1) pairs of IDTs 111. However, as long as there is not a positional difference among the centers of (N−2) pairs of IDTs 111, it is possible to achieve a small size and to keep the insertion loss small. Thus, at least (N−2) pairs of IDTs 111 should have the centers without a positional difference, as described above.

Figure 13C:
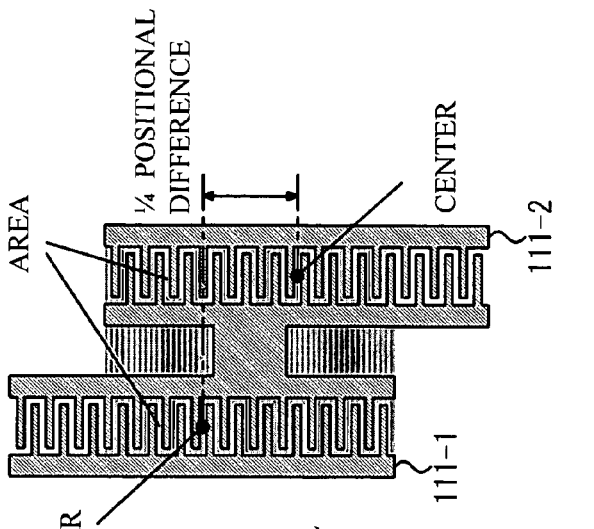
FIGS. 13A through 13C show the positional differences of the centers of two neighboring IDTs in accordance with the first embodiment.
Figure 13B:
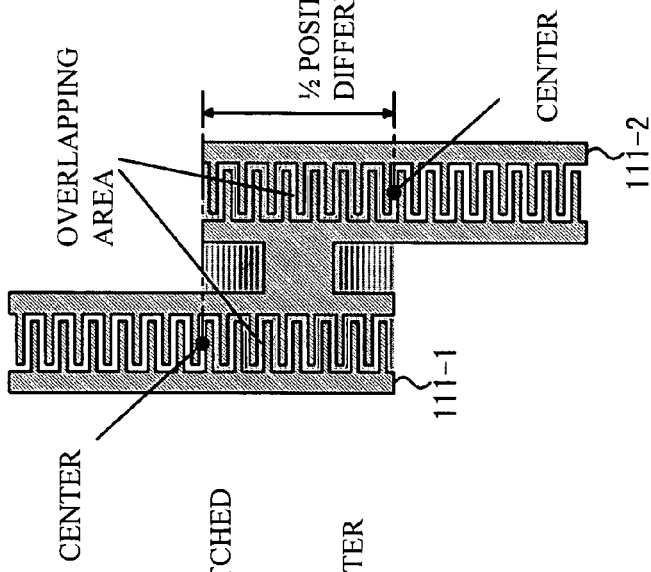
Figure 13A:
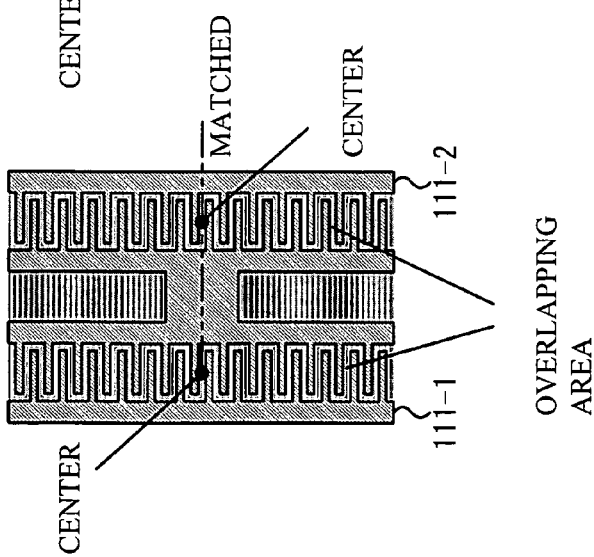

Referring now to FIGS. 13A through 13C, the reason that the positional difference in the SAW propagating direction among the IDTs 111 should be equal to or shorter than a fourth of the length in the SAW propagating direction of the IDT 111 with the larger number of pairs of electrode fingers will be described below. So as to reduce the insertion loss, each two neighboring IDTs (indicated by reference numerals 111-1 and 111-2 in FIGS. 13A through 13C) should preferably have the centers located exactly in the same position in the SAW propagating direction, as shown in FIG. 13A. So as to reduce the chip area of the ladder filter, however, it is necessary to allow for a certain margin of error. If the positional difference between the centers of the neighboring IDTs 111-1 and 111-2 is greater than a half of the length in the SAW propagating direction of the IDT 111 with the larger number of pair of electrode fingers, as shown in FIG. 13B, the overlapping area of the two IDTs 111-1 and 111-2 is smaller than the non-overlapping area, and it is considered that the two IDTs 111-1 and 111-2 deviates from one another. In such a deviating state, the insertion loss increases. Therefore, it is preferable to restrict the positional difference between the centers to a length smaller than a half of the length in the SAW propagating direction of the IDT with the larger number of pairs of electrode fingers. Accordingly, the state in which the positional difference between the centers of the neighboring IDTs 111-1 and 111-2 is equal to a half of the length in the SAW propagating direction of the IDT 111 with the larger number of pairs of electrode fingers can be regarded as the criterion for determining whether the series-arm resonators are arranged in a straight line. If the positional difference between the centers of the neighboring IDTs 111-1 and 111-2 is smaller than a half of the length in the SAW propagating direction of the IDT 111 with the larger number of pairs of electrode fingers, the series-arm resonators can be considered to be arranged transversely, which is, arranged in a straight line. In short, the margin of error allowed in the straightly aligned state is shorter than a half of the length in the SAW propagating direction of the IDT 111 with the larger number of pairs of electrode fingers. So as to further reduce the insertion loss, the margin of error is narrowed to a length shorter than a fourth of the length in the SAW propagating direction of the IDT 111 with the larger number of pairs of electrode fingers in this embodiment.

In a case where the positional difference in the SAW propagating direction between the centers of at least (N−2) pairs of neighboring IDTs 111 is smaller than a fourth of the length in the SAW propagating direction of the IDT 111 with the larger number of pairs of electrode fingers (see FIG. 10), the IDTs 112 that form the parallel-arm resonators are provided on one side of the straight line connecting the IDTs 111 that form the series-arm resonators, so that the chip area of the ladder filter 110c can be reduced. Although it is preferable to provide all the IDTs 112 on one side of the straight line connecting the IDTs 111, the chip area can be somewhat reduced by arranging the IDTs 112 in such a manner that the number of IDTs 112 on one side of the straight line connecting the IDTs 111 is two or more greater than the number of IDTs 112 on the other side of the straight line connecting the IDTs 111.

Referring now to FIGS. 14 through 17, a specific example in which the above configuration is applied to the duplexer 100 shown in FIG. 6 will be described in detail. In this specific example, the duplexer 100 is designed to be a 1.9 GHz band antenna duplexer to be used in the PCS.

Figure 14:
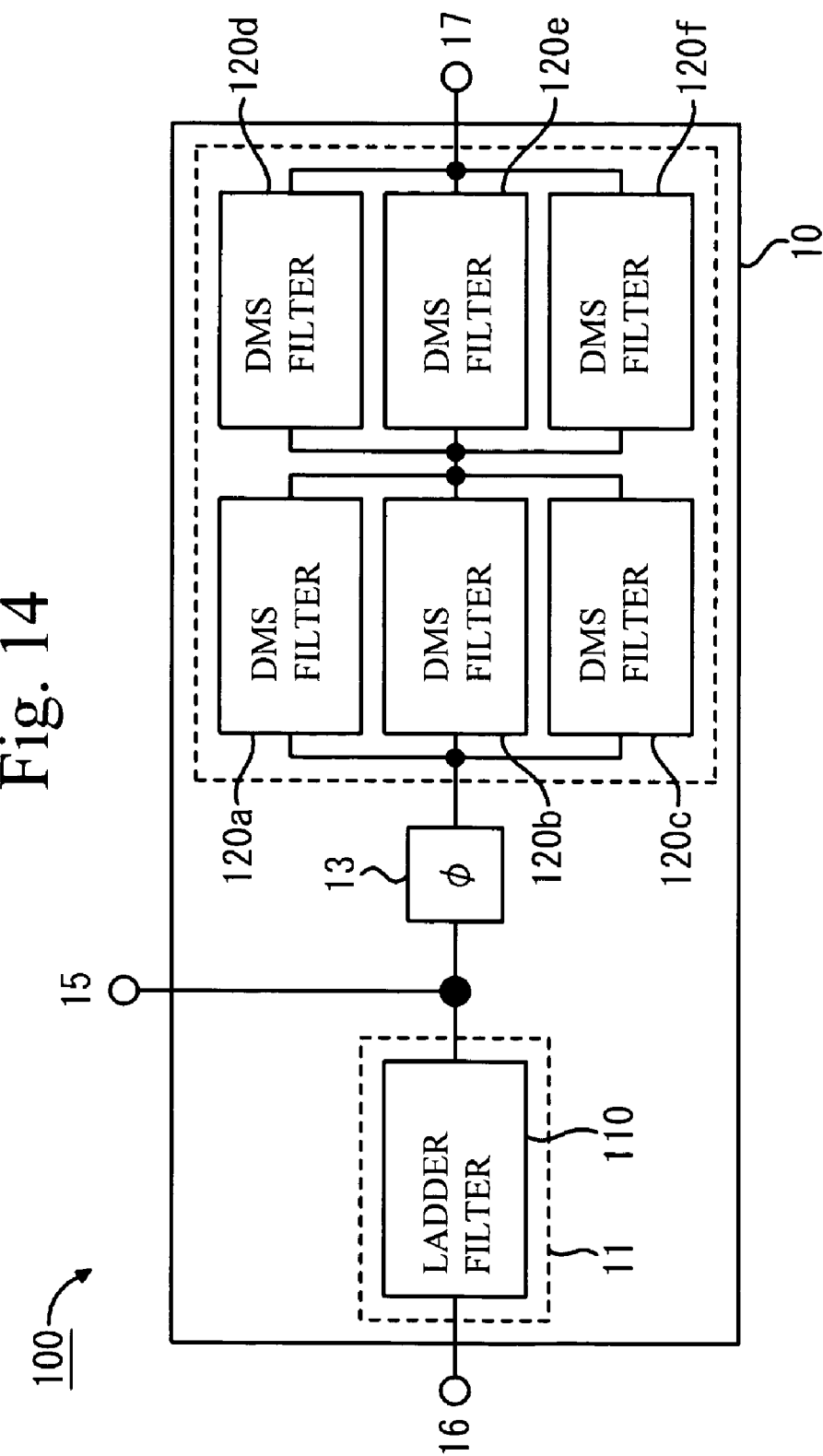
FIG. 14 is a block diagram illustrating a specific example of the duplexer in accordance with the first embodiment.
Figure 15:
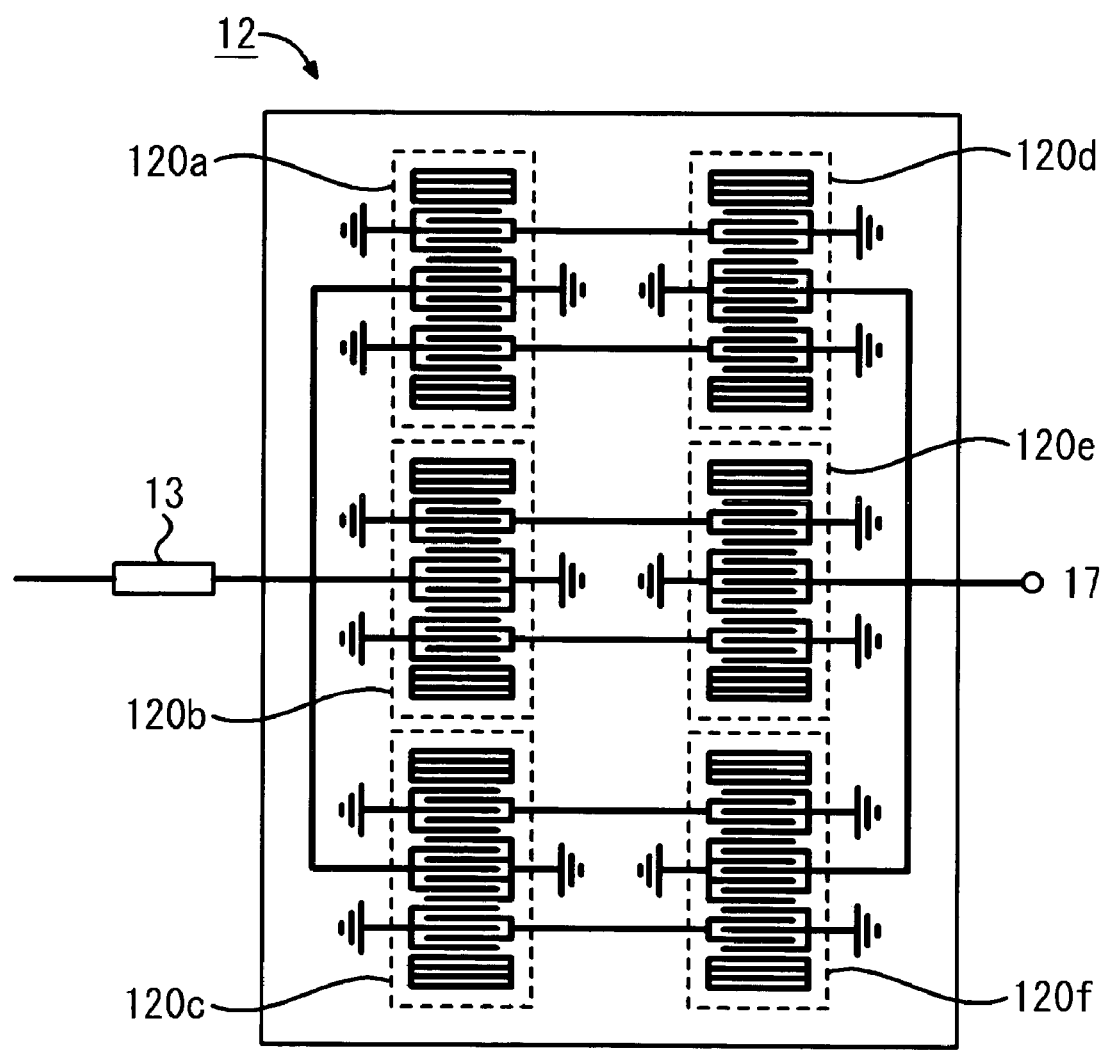
FIG. 15 is a circuit diagram showing the connections among the DMS filters shown in FIG. 14.

FIG. 14 is a circuit diagram showing the structure of the duplexer 100. In this specific example, the substrate 10 is a LT substrate. The transmission filter 11 formed on the substrate 10 is formed with the four-stage ladder filter 110 having four series-arm resonators shown in FIG. 2. The IDTs 111 that form the series-arm resonators are arranged transversely along a straight line. The reception filter 12 formed on the substrate 10 is a filter having a parallel-connected DMS multi-stage structure in which the three IDTs 121 and 122 are arranged in a row, as shown in FIG. 3, and DMS filters 120a through 120f equipped with reflectors are parallel-connected to both sides of the three IDTs 121 and 122, with the DMS filters 120a through 120c being connected to one side and the DMS filters 120e through 120f being connected to the other side, thereby realizing a two-stage DMS parallel-connected structure. FIG. 15 shows the connections among the DMS filters 120a through 120f. Although the structure shown in FIG. 15 has a single-phase input/output configuration, it is possible to employ a balanced input/output configuration. Further, a phase shifter 13 is provided between the input side of the reception filter 12 and the antenna port.

The IDTS 111, 112, 121, 122 (see FIGS. 2 and 3) that form the ladder filter 110 and the DMS filters 120a through 120f are single-layer structures produced simultaneously on the substrate 10. Each of the IDTs 111, 112, 121, and 122 has a single layer made of a electrode material mainly containing aluminum (Al), and the film thickness h of each of the IDTs 111, 112, 121, and 122 is 0.18 μm.

Figure 16:
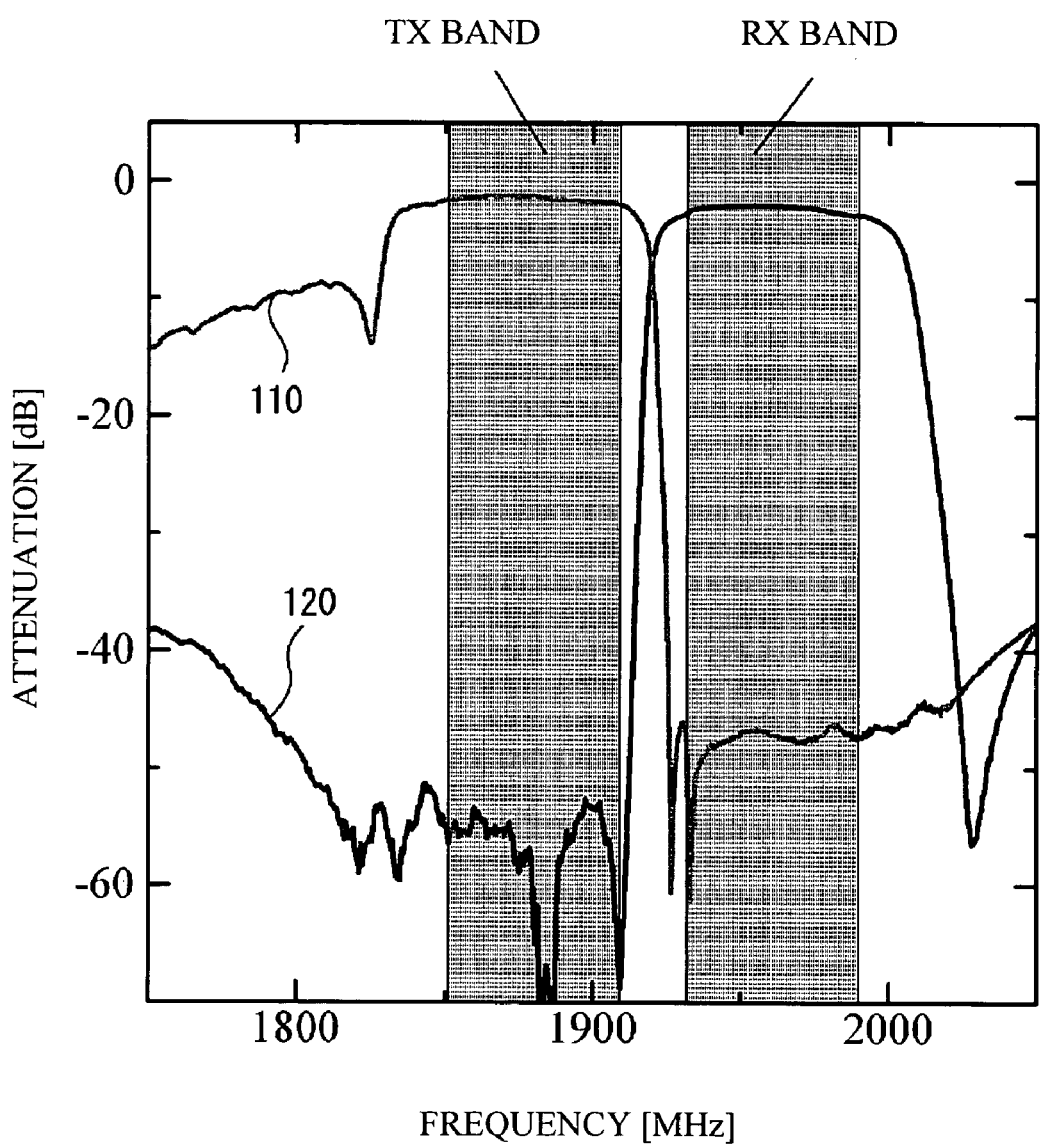
FIG. 16 is a graph showing the passband characteristics observed from the transmission side of the duplexer of the first embodiment to an antenna, and the passband characteristics observed from the antenna to the reception side of the duplexer of the first embodiment.

FIG. 16 shows the bandpass characteristics observed from the transmission side of the duplexer 100 to the antenna (i.e., the bandpass characteristics of the transmission filter 11) and the bandpass characteristics observed from the antenna to the reception side of the duplexer 100 (i.e., bandpass characteristics of the reception filter 12). As is apparent from FIG. 16, the insertion loss is −3.5 dB or smaller in the transmission band, and is −4 dB or smaller in the reception band. The degree of suppression is −50 dB or greater in the transmission band, and is −45 dB or greater in the reception band. From these results, the duplexer 100 of this specific example proves to be useful in practical use.

Figure 17:
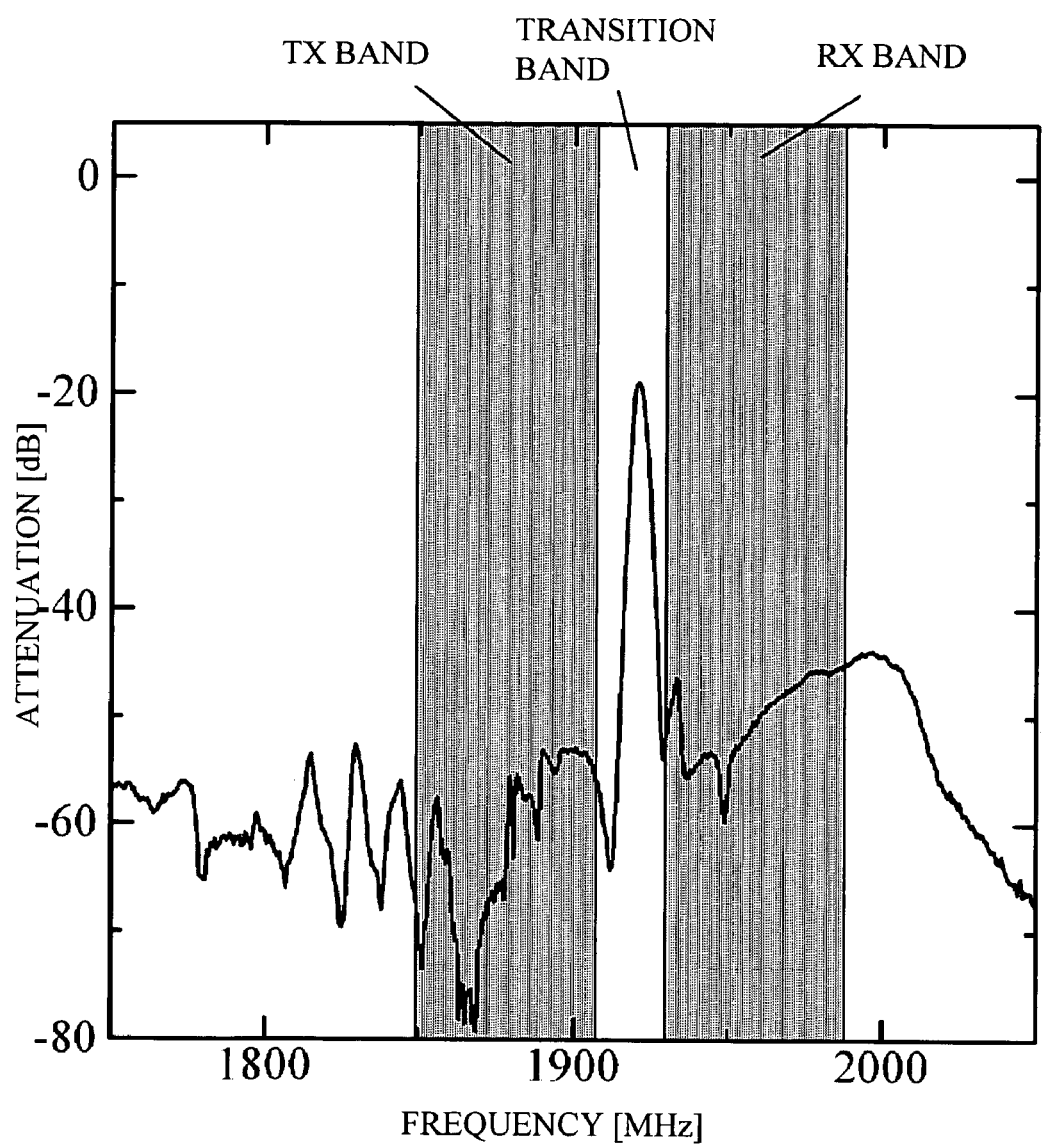
FIG. 17 is a graph showing the crosstalk characteristics observed from the transmission side to the reception side of the duplexer in accordance with the first embodiment.

FIG. 17 shows the crosstalk characteristics observed from the transmission side to the reception side of the duplexer 100. As is apparent from FIG. 17, crosstalk is restrained to −50 dB or greater in the transmission band, and is restrained to −42 dB or greater in the reception band. With these results, the duplexer 100 of this specific example proves to have excellent characteristics and to be useful in practical use.

(Second Embodiment)

Figure 18:
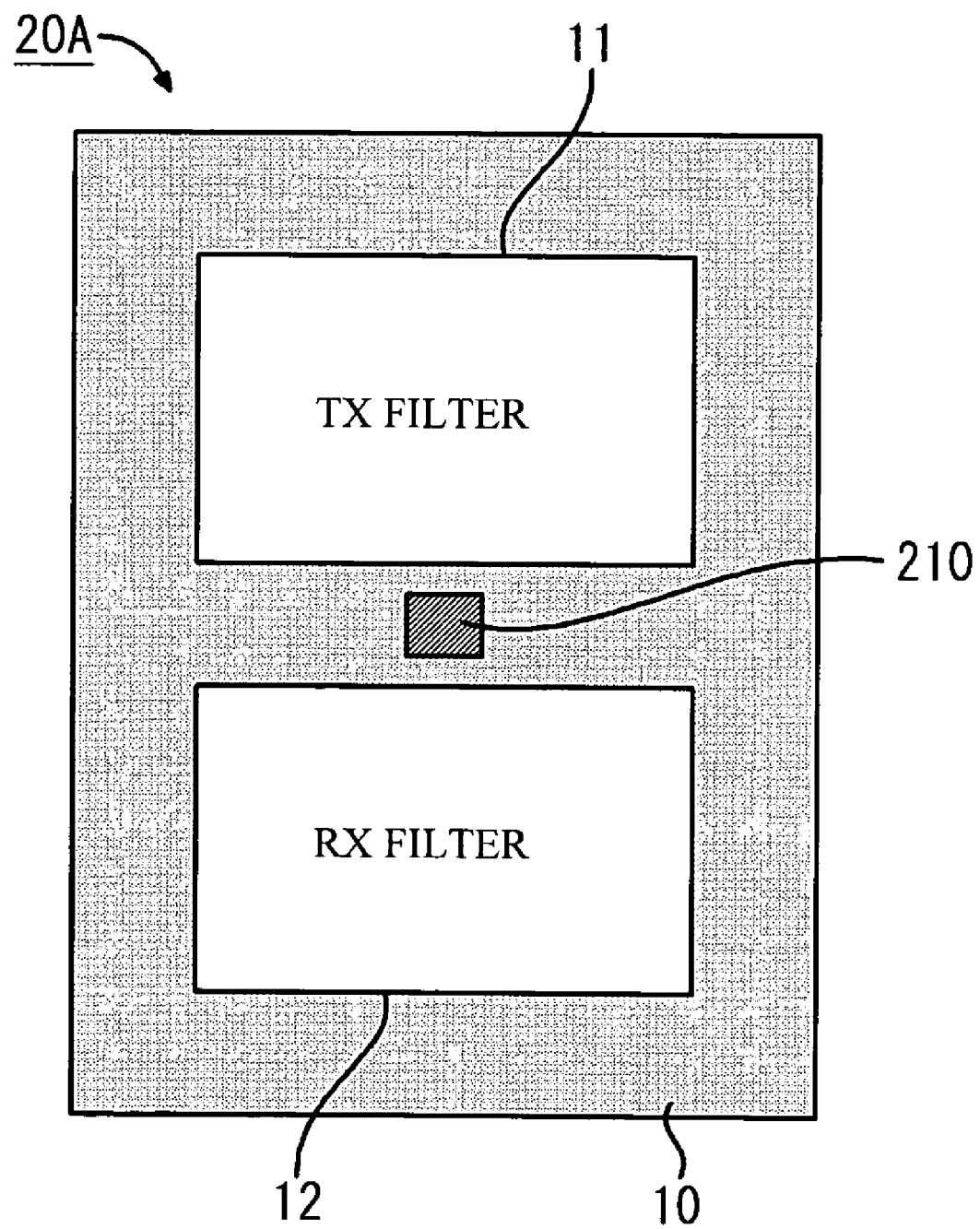
FIG. 18 is a top view of a SAW device chip of a duplexer in accordance with a second embodiment of the present invention.

Referring now to FIG. 18, a second embodiment of the present invention will be described in detail. FIG. 18 is a top view of a SAW device chip 20A of a duplexer in accordance with this embodiment. In the SAW device chip 20A, the surface having two SAW filters 11 and 12 formed thereon is regarded as the upper surface.

As shown in FIG. 18, the SAW device chip 20A of this embodiment has the same structure as the SAW device chip 10A of the first embodiment, except that a ground electrode 210 that is grounded is formed in a region sandwiched by the transmission filter 11 and the reception filter 12.

Figure 19:
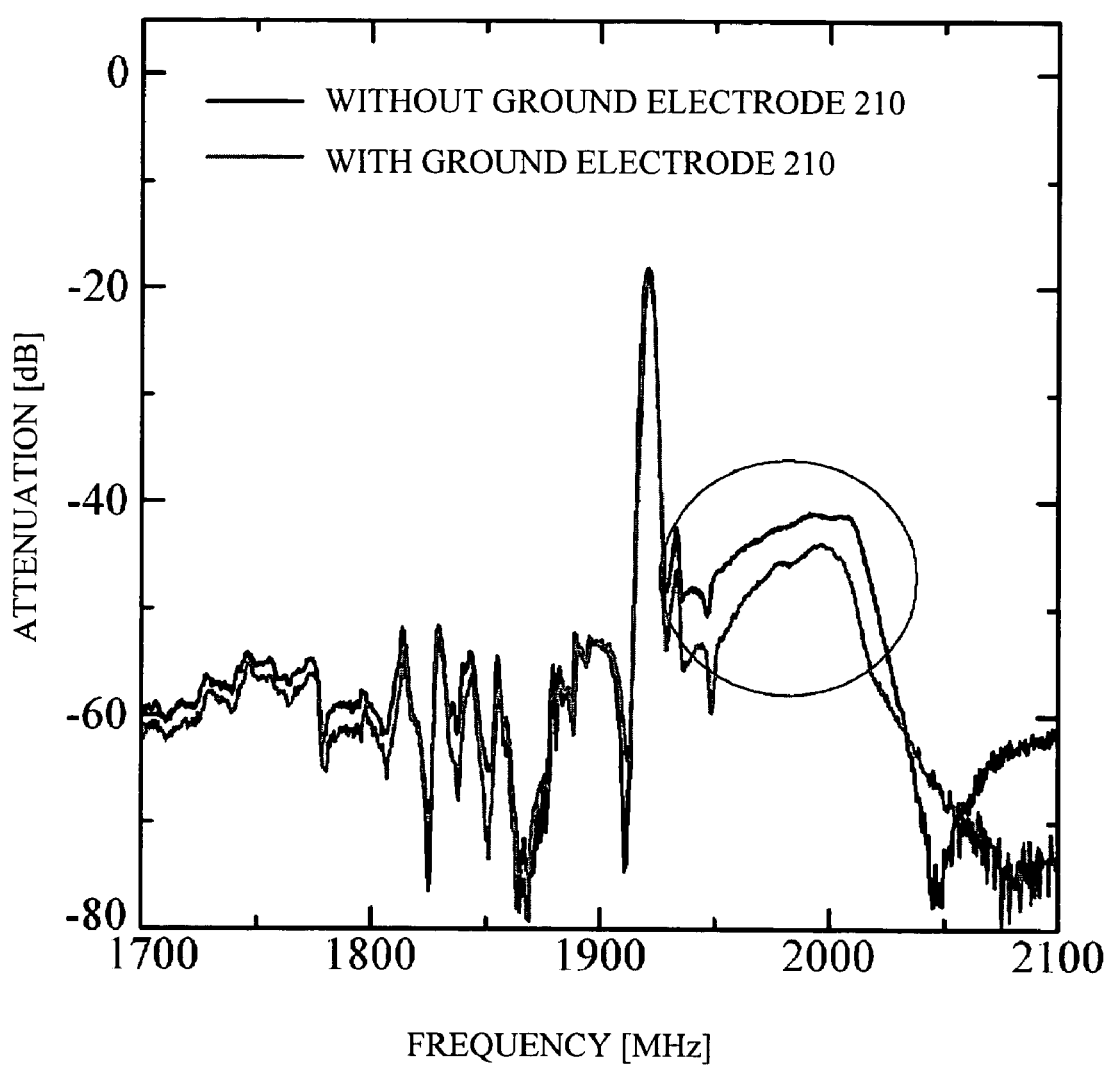
FIG. 19 is a graph showing the crosstalk characteristics of the duplexer having a ground electrode in accordance with the second embodiment, and the crosstalk characteristics of a duplexer not having a ground electrode.

In a case where the IDTs 111 and 112 of the transmission filter 11 and the IDTs 121 and 122 of the reception filter 12 are formed on the same surface of the substrate 10 like the structure of this embodiment and the first embodiment, current leakage might be caused between the transmission filter 11 and the reception filter 12 through the substrate 10. As a result, crosstalk is caused between transmission signals and reception signals, and the filter characteristics deteriorate. So as to avoid such an undesirable situation, the ground electrode 210 is provided between the transmission filter 11 and the reception filter 12, as shown in FIG. 18. With the ground electrode 210, leak current can be prevented from flowing from the transmission filter 11 into the reception filter 12 and vice versa. Thus, crosstalk can be reduced. FIG. 19 shows the crosstalk characteristics of a SAW device chip not having the ground electrode 210 formed thereon (this SAW device chip has the same structure as the SAW device chip 10A of the first embodiment), and the crosstalk characteristics of the SAW device chip 20A having the ground electrode 210 formed thereon. As is apparent from FIG. 19, the SAW device chip 20A with the ground electrode 210 exhibits better crosstalk characteristics especially in the high frequency region rather than the transmission region, i.e., in the region corresponding to the reception band (see FIG. 17).

Figure 20A:
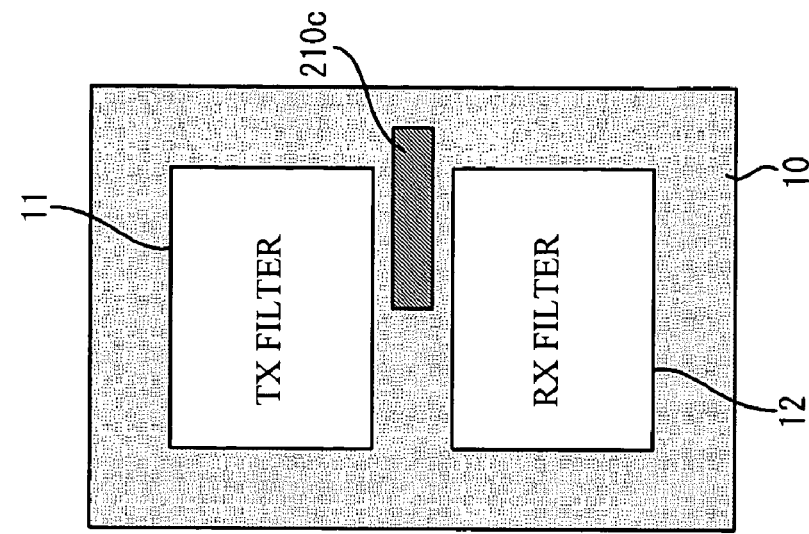
FIGS. 20A through 20C illustrate other examples of ground electrodes in accordance with the second embodiment of the present invention.
Figure 20B:
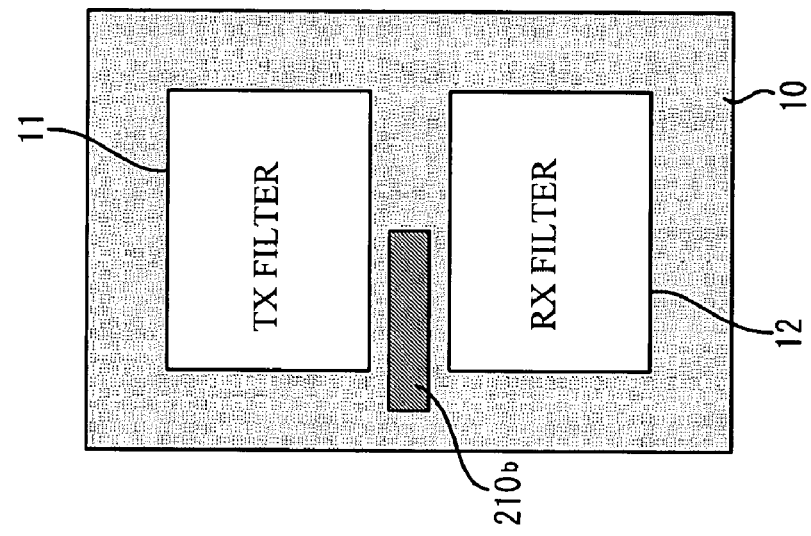
Figure 20C:
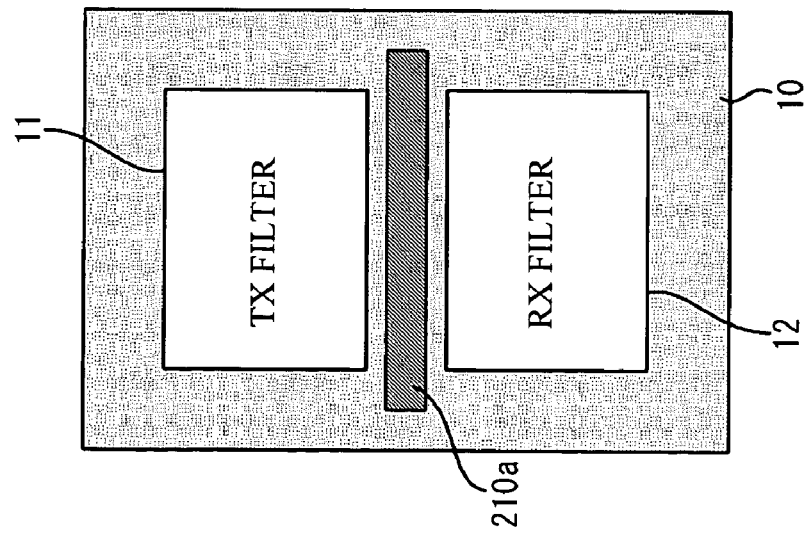

FIGS. 20A through 20C illustrate other examples of ground electrodes. Although the ground electrode 210 is provided only in one small region between the transmission filter 11 and the reception filter 12 in the structure shown in FIG. 18, it is also possible to employ a ground electrode 210a that is longer than the side of the transmission filter 11 facing the reception filter 12 or the side of the reception filter 12 facing the transmission filter 11 (in the direction perpendicular to the SAW propagating direction). In this case, the ground electrode 210a should be located in such a position as to completely shut off the transmission filter 11 and the reception filter 12 from each other. It is also possible to employ a ground electrode 210b shown in FIG. 20B or a ground electrode 210c shown in FIG. 20C. Each of the ground electrodes 210b and 210c has a length longer than a half of the length of the side of the transmission filter 11 facing the reception filter 12 or the side of the reception filter 12 facing the transmission filter 11 (in the direction perpendicular to the SAW propagating direction). In this case, each of the ground electrodes 210b and 210c should be located in such a position as to shut off the transmission filter 11 and the reception filter 12 from a half of each other. Further, the shape of each ground electrode in accordance with this embodiment is not limited to a rectangular (or square) shape shown in FIG. 18 and FIGS. 20A through 20C, but may have a circular (or oval) shape. Also, various modifications can be made to each ground electrode of this embodiment.

The ground electrode 210 (or 210a, 210b, or 210c) of this embodiment can be formed when the IDTs 111, 112, 121, and 122 of the transmission filter 11 and the reception filter 12 are formed. Here, the same electrode material as the IDTs 111, 112, 121, and 122 can be used for the ground electrode 210.

With the above structure in accordance with this embodiment, crosstalk between the transmission side and the reception side can be reduced, and improved filter characteristics can be obtained. The other aspects of this embodiment are the same as those of the first embodiment, and therefore, explanation of them is omitted herein.

(Third Embodiment)

A third embodiment of the present invention will now be described in detail. As in the first embodiment, the transmission filter 11 is the ladder filter 110 in this embodiment, and the reception filter 12 is the DMS filter 120 in this embodiment. In the first embodiment described above, each of the IDTs 111, 112, 121, and 122 of the transmission filter 11 and the reception filter 12 is a single-layer structure made of an electrode material mainly containing aluminum (Al).

Generally, it is preferable to form the IDTs 111 and 112 of the transmission filter 11 with electrode films having high power durability, because larger power is normally applied to the transmission filter 11 than to the reception filter 12. In view of this, the IDTs 111 and 112 are formed with electrode films having relatively high power durability in this embodiment.

More specifically, examples of electrode films having high power durability include metallic films each having a three-layer structure of aluminum-copper/copper/aluminum-copper (Al—Cu/Cu/Al—Cu), a multi-layer structure in which a material mainly containing aluminum (Al) and titanium are laminated, a laminated structure of aluminum-magnesium (Al—Mg), or a laminated structure of aluminum-copper-magnesium (Al—Cu—Mg).

When the IDTs 111 and 112 of the transmission filter 11 (the ladder filter 110) are formed with electrode films as described above, it is effective to form the IDTs 121 and 122 of the reception filter 12 (the DMS filter 120) having the same layer structures through the same manufacturing procedures. By doing so, the power durability of the duplexer 1 is increased. Since electric power leaking from the transmission filter 11 flows into the reception filter 12, it is necessary for the reception filter 12 to have a certain degree of power durability. As the reception filter 12 is formed with electrode films having the same power durability of those of the transmission filter 11 as described above, the power durability of the reception filter 12 (the DMS filter 120) can be increased. Also, the IDTs 111, 112, 121, and 122 of the transmission filter 11 and the reception filter 12 that are formed as the same layer structures through the same procedures are advantageous not only in that the production process can be simplified, but also in that variations in the filter characteristics due to electrode thickness variations and electrode finger width variations can be restrained.

With the above structure in accordance with this embodiment, crosstalk between transmission signals and reception signals can be reduced in the same manner as in the first embodiment, even when the IDTs 111, 112, 121, and 122 having single- or multi-layer structures made of an electrode material other than aluminum (Al). Thus, a duplexer having excellent filter characteristics can be produced.

When the IDTs 111, 112, 121, and 122 are formed with electrode films having the above described laminated structures, however, the filter insertion loss increases because the electric resistance is greater than that in a case where the IDTs 111, 112, 121, and 122 are formed with single-layer films of aluminum (Al). So as to eliminate this problem, coupled multi-mode filters (the DMS filters 120a through 120f, for example) are parallel-connected in this embodiment, like the structures of the first embodiment shown in FIGS. 14 and 15. In this manner, the electric resistance of the reception filter 12 becomes smaller, and the filter insertion loss can be reduced accordingly. The other aspects of this embodiment are the same as those of the first embodiment, and therefore, explanation of them is omitted herein.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A duplexer comprising
two surface acoustic wave filters that are formed on one substrate, at least one of the two surface acoustic wave filters being a ladder filter,
wherein
the positional difference between the centers in a surface acoustic wave propagating direction of each two neighboring comb-like electrodes among comb-like electrodes that form series-arm resonators in the ladder filter is not equal to zero and is equal to or smaller than a fourth of the length in the propagating direction of the comb-like electrode having the larger number of pairs of electrode fingers of each two neighboring comb-like electrodes.

2. The duplexer as claimed in claim 1, wherein:
the number N of comb-like electrodes that form the series-arm resonators is three or greater, N being an integer; and
the positional difference is equal to or smaller than a fourth of the length in the propagating direction of the comb-like electrode having the larger number of pairs of electrode fingers of each two neighboring comb-like electrodes, among at least (N−2) pairs of neighboring comb-like electrodes.

3. The duplexer as claimed in claim 1, further comprising a ground electrode that is provided between the two surface acoustic wave filters on the substrate.

4. The duplexer as claimed in claim 3, wherein the ground electrode has a length equal to or longer than a half of the length of each facing side of the two surface acoustic wave filters facing each other.

5. The duplexer as claimed in claim 3, wherein the ground electrode has a length equal to or longer than each facing side of the two surface acoustic wave filters facing each other, the ground electrode being located in such a position as to completely shut off the two surface acoustic wave filters from each other.

6. The duplexer as claimed in claim 1, wherein the substrate is a rotated Y-cut X-propagation lithium tantalate substrate.

7. A duplexer comprising
two surface acoustic wave filters that are formed on one substrate, at least one of the two surface acoustic wave filters being a ladder filter,
wherein
the positional difference between the centers in a surface acoustic wave propagating direction of each two neighboring comb-like electrodes among comb-like electrodes that form series-arm resonators in the ladder filter is equal to or smaller than a fourth of the length in the propagating direction of the comb-like electrode having the larger number of pairs of electrode fingers of each two neighboring comb-like electrodes, and
a first straight line connecting an input terminal integrally formed with the comb-like electrode forming the input-stage series-arm resonator of the ladder filter to an output terminal integrally formed with the comb-like electrode forming the output-stage series-arm resonator of the ladder filter deviates from the straight line extending perpendicularly to the propagating direction, so that the angle of the first straight line with respect to a second straight line connecting an input terminal to an output terminal provided in a package that accommodates the substrate is smaller than the angle of the second straight line with respect to the straight line extending perpendicularly to the surface acoustic wave propagating direction on the substrate.

8. A duplexer comprising
two surface acoustic wave filters that are formed on one substrate, at least one of the two surface acoustic wave filters being a ladder filter,
wherein
comb-like electrodes that form series-arm resonators in the ladder filter are arranged in the direction perpendicular to a surface acoustic wave propagating direction; and
a first straight line connecting an input terminal integrally formed with the comb-like electrode forming the input-stage series-arm resonator of the ladder filter to an output terminal integrally formed with the comb-like electrode forming the output-stage series-arm resonator of the ladder filter deviates from the straight line extending perpendicularly to the propagating direction, so that the angle of the first straight line with respect to a second straight line connecting an input terminal to an output terminal provided in a package that accommodates the substrate is smaller than the angle of the second straight line with respect to the straight line extending perpendicularly to the surface acoustic wave propagating direction on the substrate.

9. The duplexer as claimed in claim 8, wherein, with the ladder filter being divided into two parts by the first straight line, the difference in the number of comb-like electrodes forming parallel-arm resonators between the two parts is two or greater.

10. A duplexer comprising
two surface acoustic wave filters that are formed on one substrate, at least one of the two surface acoustic wave filters being a ladder filter,
wherein
a first straight line connecting the center of a comb-like electrode forming the input-stage series-arm resonator of the ladder filter to the center of a comb-like electrode forming the output-stage series-arm resonator of the ladder filter deviates from the straight line extending perpendicularly to a surface acoustic wave propagating direction, so that the angle of the first straight line with respect to a second straight line connecting an input terminal and an output terminal provided in a package that accommodates the substrate is smaller than the angle of the second straight line with respect to the straight line extending perpendicularly to the surface acoustic wave propagating direction on the substrate.

11. The duplexer as claimed in claim 10, wherein a comb-like electrode forming the input-stage parallel resonator of the ladder filter and a comb-like electrode forming the output-stage parallel-arm resonator are arranged on opposite sides of the straight line connecting comb-like electrodes that form the series-arm resonators of the ladder filter.

* * * * *